United States Patent

[11] 3,589,224

[72] Inventor John J. Frantzen
North Saint Paul, Minn.
[21] Appl No 767,412
[22] Filed Oct. 14, 1968
[45] Patented June 29, 1971
[73] Assignee Buckee-Mears Company
St. Paul, Minn.

[54] DIE PUNCHING PRINTED CIRCUIT
5 Claims, 6 Drawing Figs.

[52] U.S. Cl. .......... 83/100, 83/103
[51] Int. Cl. .......... B26d 7/18
[50] Field of Search .......... 83/98—100, 102, 103, 925, 926, 27; 93/36 A

[56] References Cited

UNITED STATES PATENTS

| | | | |
|---|---|---|---|
| 3,162,077 | 12/1964 | Brummer .......... | 83/99 |
| 3,263,882 | 8/1966 | Nugent et al. .......... | 83/103 X |

FOREIGN PATENTS

| | | | |
|---|---|---|---|
| 946,734 | 1/1964 | Great Britain .......... | 83/100 |

*Primary Examiner*—William S. Lawson
*Attorney*—Stryker and Jacobson

ABSTRACT: Circuit patterns are formed by punching or stamping them out of a sheet of material with a die punch. The severed sections are then separated by holding one of the sections in place in the die punch with a vacuum. The same apparatus that stamps out the circuits is also used for attaching the punched-out circuit pattern to a supporting layer.

INVENTOR
JOHN J. FRANTZEN

BY Stryker and Jacobson
ATTORNEYS

INVENTOR
JOHN J. FRANTZEN
BY Stryker and Jacobson
ATTORNEYS

DIE PUNCHING PRINTED CIRCUIT

BACKGROUND OF THE INVENTION

1. Field of the Invention

This invention is directed for use principally in what is commonly known as the printed circuit art in which thin layers of electrically conductive material are formed on flat supporting sheets of insulating material. It should be recognized however, that there may be other fields which do not involve electrically conductive materials to which this invention with its accompanying advantages and features might be equally applicable.

2. Description of the Prior Art

Printed circuits have been formed by a number of different methods using a variety of machines, tools and equipment. One of the most common methods used today for making printed circuits is the photo-etching process wherein a sheet of copper which is laminated to a supporting insulating layer is coated in a desired pattern with a suitable etchant-resist and the uncoated areas of copper are then etched away leaving the desired circuit patterns of copper. Other methods use electroplating techniques and punching processes. Ordinarily, the latter has the advantage of being less costly since a large number of circuits can be repetitively stamped out at a relatively low cost. However, one of the biggest drawbacks to the die punching or stamping method heretofore has been the difficulty and the expense of bonding the stamped out pattern to a suitable supporting layer. Also, because the circuits are so relatively thin, they are difficult to process so that when large batches of the circuits are punched out, difficulties are encountered in handling the individual pieces when later trying to bond them to insulating layers. The present invention alleviates those drawbacks while at the same time achieves and retains all of the advantages of producing printed circuits in this fashion.

SUMMARY

The circuit pattern is die punched out of a thin sheet of material such as copper, for example, in the usual fashion by bringing a pressure plate and the cutting face of a die together with a sheet of material in between. The die face contains elevated ridges defining the edges of the desired circuit patterns which sever the sheet of material into circuit pattern sections and non-circuit pattern sections. One of these sections is then held in place by a vacuum while a supporting layer, for example, an insulating sheet of Mylar, is bonded or attached to the circuit pattern section and then the combination is separated from the rest of the material. In one embodiment of the invention, the circuit patterns are held in place by the vacuum until attached to the supporting layer after which time the vacuum holding force is released. In another embodiment of the invention, the noncircuit pattern section is held in place by the vacuum while the circuit pattern section is being bonded to the supporting layer. Apparatus for producing circuits by these methods may take the form of the usual flatbedded die or, for example, a rolling wheel or disc die which operates on a continuously moving strip of material.

DESCRIPTION OF THE PREFERRED EMBODIMENTS

Figure 1:
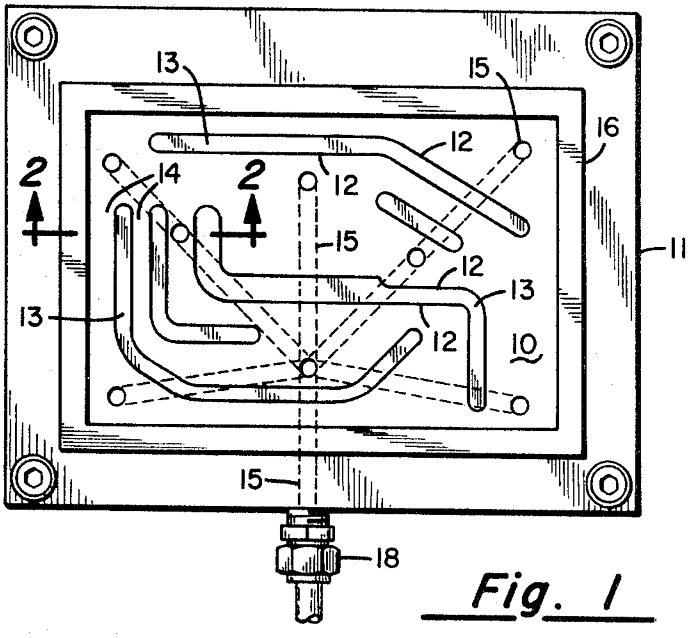
FIG. 1 is a view of the cutting face of a die which is used in one embodiment of the invention.
Figure 2:
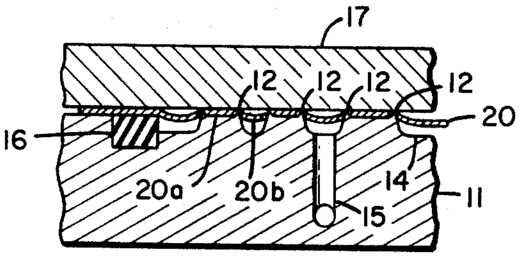
FIG. 2 is a sectional view of a portion of a die-stamping machine containing the die illustrated in FIG. 1.

Turning first to FIGS. 1 and 2, the cutting face 10 of a die block 11 contains partially-raised somewhat sharp shears or cutters 12 which define the edges of circuit pattern areas 13 which are to be severed or cut out of a thin sheet of material. For electrical printed circuits this would be a good conducting metal such as copper, for example. The cutters 12 define the outside edges of depressed areas or channels 14, corresponding to non-circuit pattern areas, as well as the relatively flat elevated areas 13 corresponding to the circuit pattern areas. Communicating with each of the depressed areas 14 through the body of the die 11 are chambers 15 which have openings in the depressed areas 14 and are connected back through an appropriate fitting 18 to a suitable vacuum source, not shown. A vacuum gasket 16, which is made out of a suitable material, surrounds the cutting face 10 of the die 11 and its function will become apparent from the later detailed description of the steps involved in the process. Above the die 11, opposite the cutting face 10, is a pressure plate 17 which is mounted in any convenient manner to some type of mechanism, not shown, for moving the pressure plate toward and away from the die and for applying some degree of force against the die cutting faces. The die body itself is supported in the usual fashion on a stand or table or something equally suitable.

The characteristics and the thickness of the material being cut are the main determining factors for the various dimensions on the cutting areas of the die face but in a typical case, the depressed areas 14 may be in the order of 0.020 inch deep and the cutters 12 may be in the order of 0.003 above the elevated land areas 13 and have a nominal thickness in the order of 0.002 inch. These dimensions of course are not intended to be limitive but are only illustrative. The cutting face of the die can be formed by machining but preferably is formed by etching techniques in which the desired circuit pattern is layed out on the face of the die block and then the land areas 13 and the depressed areas are etched down to the desired size using controlled etching processes. These etching techniques for forming the cutting areas on the die face permit a wide variety of sizes, shapes and forms of the printed circuit patterns to be produced on the die face. In ordinary machining techniques there is a great deal less flexibility to the types of patterns which can be machined on the die face. It has also been found that by its inherent nature, the etching process produces well-defined cutters 12.

Figure 3:
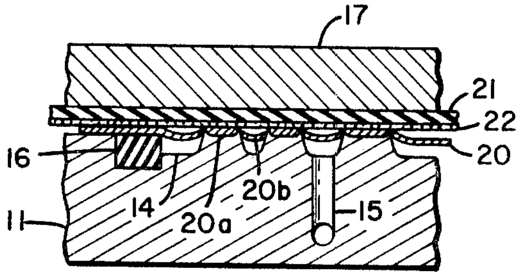
FIGS. 3 and 4 illustrate the equipment shown in FIG. 2 as it appears in various stages of the process for making the printed circuit according to one embodiment of the invention.
Figure 4:
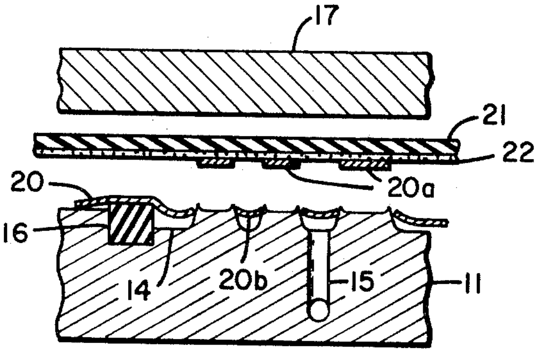

Turning to FIGS. 2, 3 and 4, the steps involved in producing printed circuits using the apparatus described heretofore, will now be described. A relatively thin sheet of copper 20, for example in the order of 0.0025 inch thick, is laid over the die face 10. The pressure plate 17 is then brought down to bear on the copper sheet 20 pressing it against the cutting edges 12 on the die face 10 until they sever the sheet of copper into the circuit pattern sections and the noncircuit pattern sections, **20*a* and 20*b* respectively. While the pressure is being applied, the vacuum source, not shown, may be energized so that vacuum is applied into the depressed areas 14 corresponding to the noncircuit pattern sections pulling those corresponding copper areas, 20*b*, down into the cavities while the circuit pattern areas of copper, 20*a*, rest on the corresponding elevated areas 13. The pressure plate 17 is then moved away and the vacuum may be shut off or may remain energized as desired. While the vacuum is still holding the noncircuit portions of copper in place on the die, the circuit pattern sections 20*a* which have been severed from the copper sheet can then be removed for further processing and then the vacuum can be shut off and the remaining sections, 20*b*, can be removed and discarded. However, it is preferable to separate the two severed sections of copper by attaching the circuit pattern sections to a supporting layer. This is accomplished by placing the supporting layer 21 which illustratively, may be a sheet of Mylar with a coating of adhesive 22, over the copper with the adhesive coating facing downward and then again bringing pressure plate 17** down to bear on the Mylar while the vacuum source is energized. If a pressure sensitive adhesive is used, after a short time the pressure plate 17 and the Mylar 21 are raised away from the die and the circuit pattern sections of copper 20*a* will be attached to the Mylar 21 as illustrated in FIG. 4. The noncircuit pattern sections 20*b* will remain on the die and can be removed and discarded.

It is also contemplated that a thermoplastic adhesive can be used. In that event, while the pressure plate 17 is pressing the copper circuit pattern areas onto the adhesive on the Mylar, the temperature of the adhesive is elevated to plasticize it and then it is allowed to cool down for a suitable period of time so that the adhesive sets and bonds the circuits tightly to the insulating layer. It is well within the knowledge of one of ordinary skill in the art to think of a number of ways by which this temperature can be controlled. For example, electric heating coils can be mounted around or in the body of the die and a suitable amount of current passed therethrough to raise the ambient temperature the desired degree. It is also possible to preheat the adhesive coated insulating layer just before inserting it in the press so that the adhesive is in plasticized form while the copper circuit areas are being pressed against it. While being held firmly under pressure the adhesive is allowed to set as the temperature drops. Since the plasticizing temperature of the adhesive, as well as the temperature and time necessary to make it take a firm set, are dependent upon the characteristics of the adhesive being used, and the requirements are dependent upon the system used, including what amount of time is necessary to transport a preheated sheet of adhesive coated Mylar to the die press, some experimentation ordinarily will be necessary in each case to determine the optimum temperature setting. After one or two runs or passes the correct settings can be determined.

Figure 5:
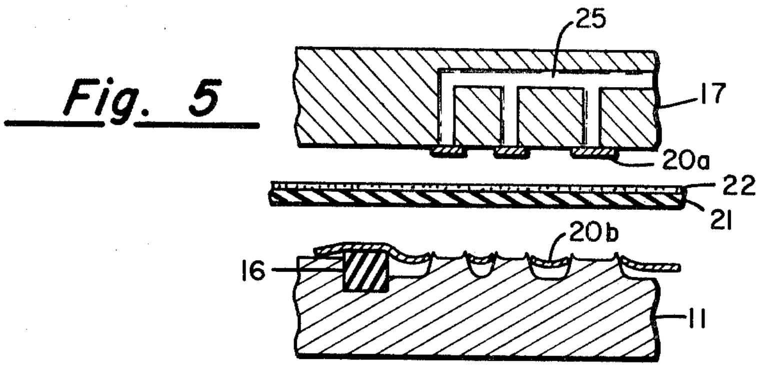
FIG. 5 illustrates a variation of a die press unit suitable for making printed circuits according to the teachings of the invention.

Turning now to FIG. 5, the die 11 may be constructed in the same fashion as illustrated in FIGS. 1 and 2 except that in this embodiment passageways 25 connected to the vacuum source are located in the pressure plate 17 and open on the face of the pressure plate in those areas corresponding to the circuit pattern areas. This unit operates similar to that described above except that after the circuit pattern is stamped out by bringing the pressure plate 17 down to bear on the copper 20 which rests on the die face 11, the vacuum source is energized and the pressure plate 17 moved away from the die so that the circuit pattern areas of the copper, 20*a*, are held by the vacuum and lifted off the die face 11. Mylar 21 or other suitable supporting layer material, with adhesive coating 22 is then inserted under the pressure plate 17 and the latter is once again brought down to bear on the Mylar to bond the circuit pattern areas to the Mylar and the vacuum is released. It should be pointed out that since the supporting layer 21 is resting against the cutters 12 on the die face there is some tendency for the latter to cut into the former. However, ordinarily this has not been much of a problem because usually the supporting layer material is either resilient or strong enough so that it is not pierced. However, in some instances it may be necessary to insert a spacer element (not shown) under the supporting layer during the bonding operation in order to prevent the layer from being cut.

'Referring back again to FIGS. 1—4, in a variation of the process, it is contemplated that the printed circuits can be produced by processing a supporting layer which initially is covered over with a sheet of relatively thin material which is initially bonded only very weakly to the insulating layer. When the pressure plate bears down upon the back of the supporting layer pressing the thin sheet of material against the cutting face of the die, the circuit patterns are formed in the manner described previously and the noncircuit pattern areas are drawn away from the adhesive and down into the depressions by the force of the vacuum. At the same time the circuit pattern areas are being pressed more firmly against the supporting layer to bond them more securely thereto. This method has the distinct advantage of requiring only a single processing step to produce the bonded printed circuits thereby eliminating one step in the operation.

Figure 6:
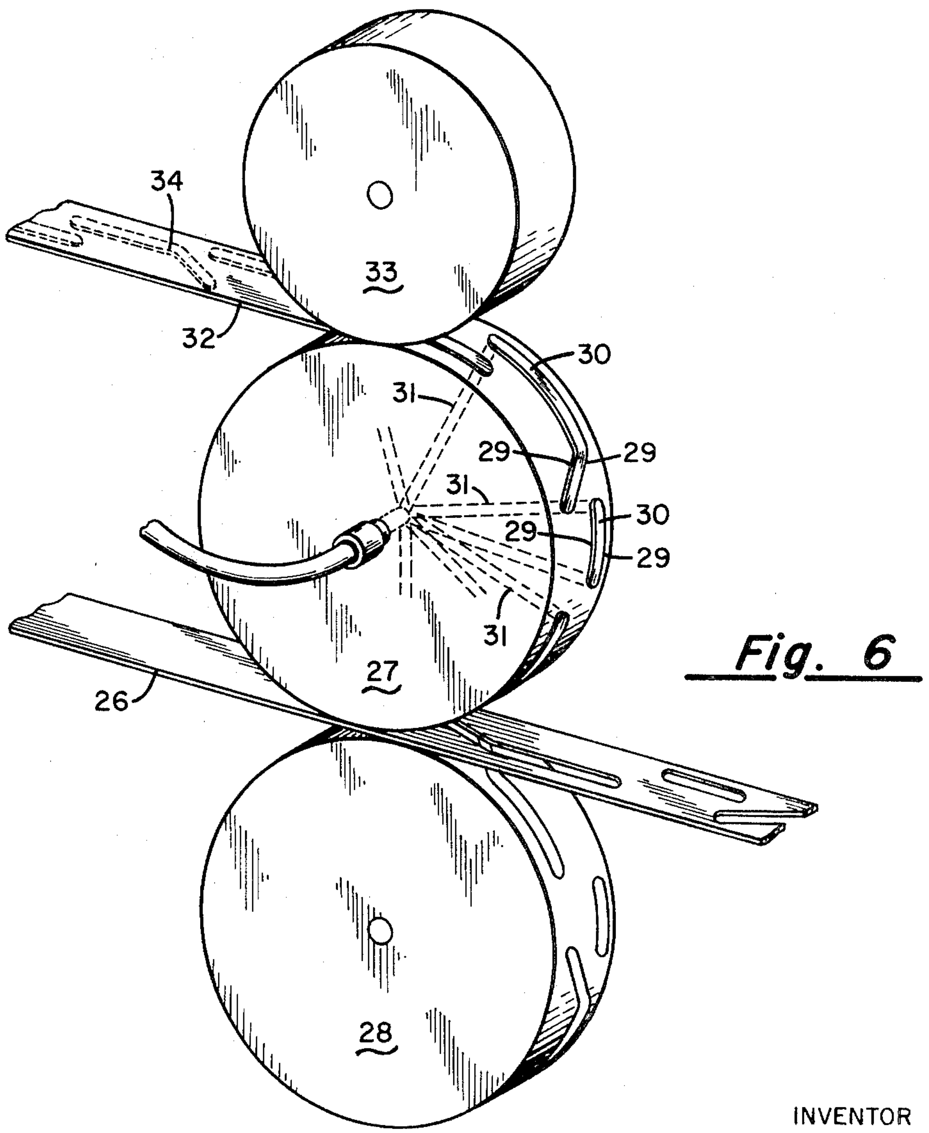
FIG. 6 illustrates a wheel or disc type die press suitable for making printed circuits in the manner as taught by this invention.

Another embodiment of the invention is illustrated in FIG. 6. A thin sheet of material 26, which again might be copper, is drawn between a pair of pinching rollers 27 and 28. The latter act on the copper sheet 26 to cut out circuit pattern areas. Wheel 27 contains relatively sharp cutting edges or cutters 29 defining circuit pattern areas 30 similar to the earlier-described flat dies. Passageways 31 through the wheel bring the circuit pattern areas 30 into communication with a vacuum source, not shown, so that the severed circuit pattern sections are separated from the copper strip 26 while the noncircuit pattern areas of copper continue on and may be discarded. A supporting strip of material 32, which again might be Mylar, which preferably has an adhesive coating, passes between roller 27 and another pinching roller 33. Preferably the adhesive on the strip 32 is pressure sensitive so that the pressure between rollers 27 and 33 bonds the severed circuit pattern areas of copper 34 onto the strip as the rollers rotate. Although pressure sensitive adhesive is preferred, other adhesives, such as thermoplastic or even thermosetting adhesives, can be used with satisfactory results.

When adhesive is used to bond the circuits, especially so when pressure sensitive adhesive is used, it may be advisable to cover over the circuit pattern side of the laminate with a layer of suitable material, not only to secure the adhesive bond but also to protect against foreign matter sticking to the exposed adhesive. It is also contemplated that by using pressure sensitive adhesives a number of layers of circuits can be formed in the manner described and be bonded one to another to form multiple layer circuits.

Although in the first two embodiments described above the die was the fixed element and the pressure plate was movable, no limitation thereto was intended since either one or both can be movable and as described, either one could contain the passageways for the vacuum to hold either the circuit pattern areas or the noncircuit pattern areas of material as the case may be. It should also be pointed out that in a further variation of the described embodiments, passageways can be suitably arranged and located within the body of the die or pressure plate or roller, or all three, and pressurized air can be applied through these passageways to forcefully push away the section not being held in place by the vacuum. For example in the embodiment first described above, relative to FIGS. 1—4, there may be passageways through the die 11 connecting a source of pressurized air, not shown, to the circuit pattern areas 13 in the die face. The air source would then be energized during the bonding operation to force the circuit pattern sections of copper 20*a* against the adhesive coated supporting layer.

I claim:

1. Apparatus for making circuit patterns by stamping them out of a sheet of material comprising:

a. a die having a cutting face containing raised ridges to form cutters defining the edges of the desired circuit patterns;

b. pressure plate means for pressing a sheet of material against the die face until the cutters sever the sheet of material; and c. means for applying a vacuum to hold one severed section in place while separating the severed section.

2. The apparatus as described in claim 1 wherein the vacuum applying means comprises: a number of passageways having openings on the face of the pressure plate connected to a vacuum source, said openings being in those areas corresponding to the circuit pattern sections for holding the circuit pattern sections in place on the pressure plate when the latter is moved away from the die.

3. The apparatus as in claim 1 wherein the vacuum applying means comprises: a number of passageways having openings on the face of the die connected to a vacuum source, said openings being in those areas corresponding to the noncircuit pattern sections.

4. The apparatus as described in claim 3 wherein said passageways comprise: depressed areas in said die face between the cutters in those areas corresponding to the noncircuit pattern section; and chambers in the die body communicating between the vacuum source and said depressed areas.

5. The apparatus as described in claim 4 wherein the areas on the die face corresponding to the circuit pattern sections are elevated above the depressed areas whereby the noncircuit pattern sections are drawn down into the depressed areas by the vacuum while the circuit pattern sections remain elevated.